(12) United States Patent
Liang et al.

(10) Patent No.: US 11,056,196 B2
(45) Date of Patent: Jul. 6, 2021

(54) METHODS OF ENHANCING SPEED OF READING DATA FROM MEMORY DEVICE

(71) Applicant: Yangtze Memory Technologies Co., Ltd., Wuhan (CN)

(72) Inventors: Ke Liang, Wuhan (CN); Li Xiang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/736,754

(22) Filed: Jan. 7, 2020

(65) Prior Publication Data

US 2021/0166769 A1 Jun. 3, 2021

Related U.S. Application Data

(63) Continuation of application No. PCT/CN2019/121510, filed on Nov. 28, 2019.

(51) Int. Cl.
*G11C 16/26* (2006.01)
*G11C 16/08* (2006.01)
*G11C 16/04* (2006.01)

(52) U.S. Cl.
CPC .......... *G11C 16/26* (2013.01); *G11C 16/0483* (2013.01); *G11C 16/08* (2013.01)

(58) Field of Classification Search
CPC ..................................................... G11C 16/26
USPC .................................................... 365/185.23
See application file for complete search history.

(56) References Cited

U.S. PATENT DOCUMENTS

| 7,064,981 B2 * | 6/2006 | Roohparvar ....... G11C 16/0483 365/185.02 |
| 7,180,787 B2 * | 2/2007 | Hosono ................. G11C 16/08 365/185.24 |
| 8,472,266 B2 | 6/2013 | Khandelwal |
| 9,558,794 B2 | 1/2017 | Lee |
| 9,640,273 B1 * | 5/2017 | Chen ..................... G11C 16/10 |
| 9,947,408 B2 | 4/2018 | Shano |
| 2008/0186776 A1 * | 8/2008 | Kim ....................... G11C 16/08 365/185.23 |
| 2016/0064056 A1 * | 3/2016 | Kim .................... G11C 11/4085 365/189.11 |

(Continued)

FOREIGN PATENT DOCUMENTS

| CN | 207302634 U | 5/2018 |
| CN | 108538333 A | 9/2018 |
| CN | 108735265 A | 11/2018 |

(Continued)

*Primary Examiner* — Muna A Techane
(74) *Attorney, Agent, or Firm* — Winston Hsu

(57) ABSTRACT

A memory device includes N rows of memory cells and N word lines coupled thereto, respectively. A method of reading data from the memory device includes: applying a first pre-pulse voltage to an nth word line while applying a second pre-pulse voltage to an adjacent word line adjacent to the nth word line, the second pre-pulse voltage exceeding the first pre-pulse voltage, and n being an integer ranging from 1 to N; grounding the nth word line while maintaining the second pre-pulse voltage on the adjacent word line; pulling a voltage on the nth word line towards a start read level; and prior to the voltage on the nth word line reaching the start read level, driving a voltage on the adjacent word line to the first pre-pulse voltage.

16 Claims, 7 Drawing Sheets

(56) References Cited

U.S. PATENT DOCUMENTS

2017/0032844 A1 2/2017 Kim
2018/0276072 A1 9/2018 Kodama

FOREIGN PATENT DOCUMENTS

| CN | 110021329 A | 7/2019 |
| KR | 10-2018-0008173 A | 1/2018 |

* cited by examiner

METHODS OF ENHANCING SPEED OF READING DATA FROM MEMORY DEVICE

CROSS REFERENCE TO RELATED APPLICATIONS

This application is a continuation of PCT patent application No. PCT/CN2019/121510, filed on 28 Nov. 2019, included herein by reference in its entirety.

BACKGROUND OF THE INVENTION

1. Field of the Invention

The invention relates to memory, and in particular, to methods of enhancing a speed of reading data from a memory device.

2. Description of the Prior Art

Non-volatile memory has been used extensively in personal computers, telecommunications, consumer electronics and other fields for data storage. Electrically erasable programmable read only memory (EEPROM) and flash memory are among the most widely employed non-volatile memory.

SUMMARY OF THE INVENTION

According to one embodiment, a method of reading data from a memory device is disclosed. The memory device includes N rows of memory cells and N word lines coupled thereto, respectively. The method includes: applying a first pre-pulse voltage to an nth word line while applying a second pre-pulse voltage to an adjacent word line adjacent to the nth word line, the second pre-pulse voltage exceeding the first pre-pulse voltage, and n being an integer ranging from 1 to N; grounding the nth word line while maintaining the second pre-pulse voltage on the adjacent word line; pulling a voltage on the nth word line towards a start read level; and prior to the voltage on the nth word line reaching the start read level, driving a voltage on the adjacent word line to the first pre-pulse voltage.

According to another embodiment, a method of reading data from a memory device is disclosed. The memory device includes N rows of memory cells and N word lines coupled thereto, respectively. The method includes: applying a first pre-pulse voltage to an nth word line while applying a second pre-pulse voltage to an adjacent word line adjacent to the nth word line, the second pre-pulse voltage exceeding the first pre-pulse voltage, and n being an integer ranging from 1 to N; grounding the nth word line while maintaining the second pre-pulse voltage on the adjacent word line; and floating the adjacent word line while pulling a voltage on the nth word line towards a start read level.

These and other objectives of the present invention will no doubt become obvious to those of ordinary skill in the art after reading the following detailed description of the preferred embodiment that is illustrated in the various figures and drawings.

DETAILED DESCRIPTION

Although embodiments of the invention will be described with reference to a 2-dimentional NAND flash devices, it will be understood that embodiments of the present inventive concept are not limited thereto to this configuration but are also applicable to a 3-dimentional NAND flash memory device. In addition, the invention is applicable to other nonvolatile memory devices, such as an Electrically Erasable and Programmable ROM (EEPROM), a NOR flash memory, a Phase-change RAM (PRAM), a Magnetic RAM (MRAM), a Resistive RAM (RRAM), a Ferroelectric RAM (FRAM), and the like, without departing from the scope of the present invention.

Figure 1:
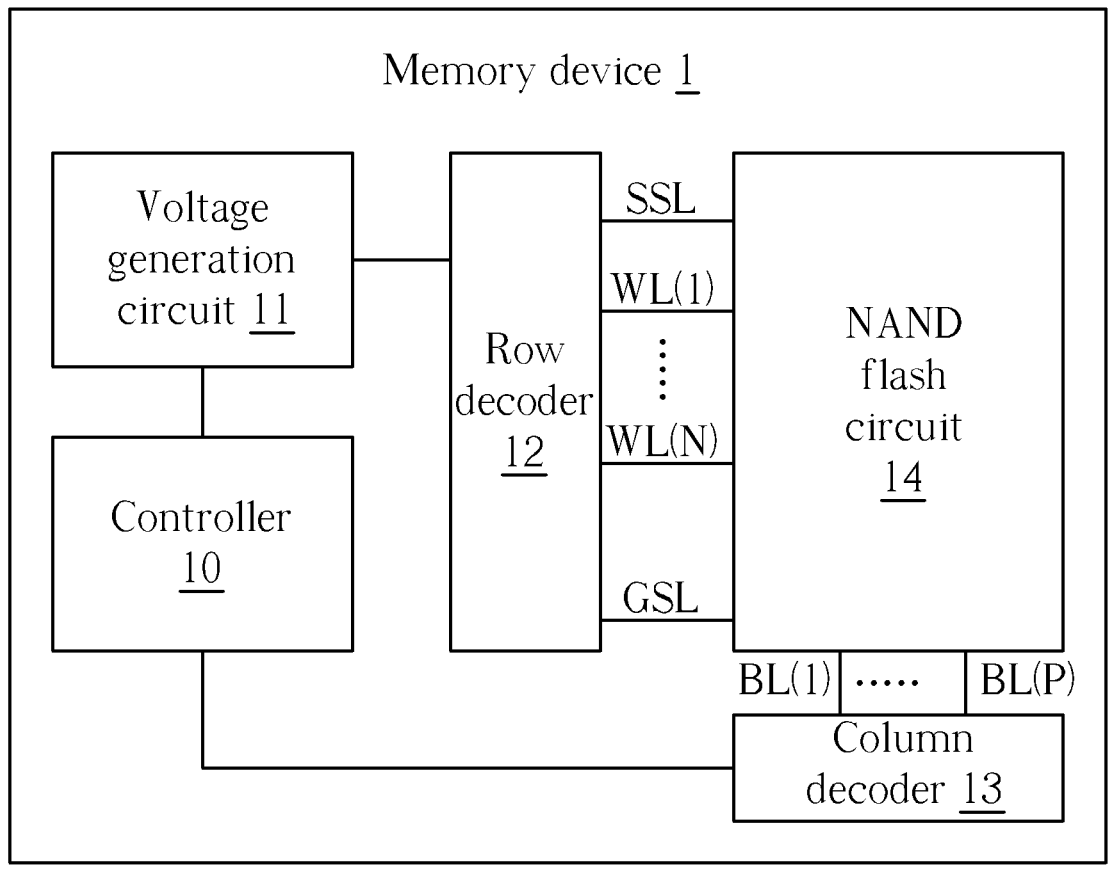
FIG. 1 is a block diagram of a memory device according to an embodiment of the invention.

FIG. 1 is a block diagram of a memory device 1 according to an embodiment of the invention. The memory device 1 may include a controller 10, a voltage generation circuit 11, a row decoder 12, a column decoder 13 and a NAND flash circuit 14. The controller 10 is coupled to the voltage generation circuit 11 and the column decoder 13. The voltage generation circuit 11 is coupled to the row decoder 12. The row decoder 12 may be coupled to the NAND flash circuit 14 via a string select line SSL, word lines WL(1) to WL(N) and a ground select line GSL, N being a positive integer, e.g., N=64. The column decoder 13 may be coupled to the NAND flash circuit 14 via bit lines BL(1) to BL(P), P being a positive integer, e.g., P=8192. The row decoder 12 may reduce time required for setting up the word lines WL(1) to WL(N) prior to a read operation.

The controller 10 may communicate with an external host to receive data for storage in the NAND flash circuit 14 and to transmit data fetched from the NAND flash circuit 14. The controller 10 may receive commands, addressor data from the external host and generate a column address signal, a row address signal and a voltage control signal. The voltage generation circuit 11 may generate voltages in response to the voltage control signal from the controller 10. In some embodiments, the voltage generation circuit 11 may generate read levels and pre-pulse voltages for use in a read operation. The row decoder 12 may operate in response to the column address signal from the controller 10 to select an appropriate word line WL(n), and provide the various voltages from the voltage generation circuit 11 to the selected word line WL(n), unselected word lines WL(1) to WL(n−1), WL(n+1) to WL(N), the string select line SSL and the ground select line GSL for read, program or erasure operations, n being an integer and 1≤n≤N. In some embodiments, the row decoder 12 may apply the read levels and pre-pulse voltages to the word lines WL(1) to WL(N) in the read operation. The column decoder 13 may operate in response to the column address signal from the controller 10 to select one or more bit lines BL(p), p being an integer and 1≤p≤P. The column decoder 13 may include a sense amplifier to detect currents from the selected bit lines BL(p), thereby reading data from the NAND flash circuit 14.

Figure 2:
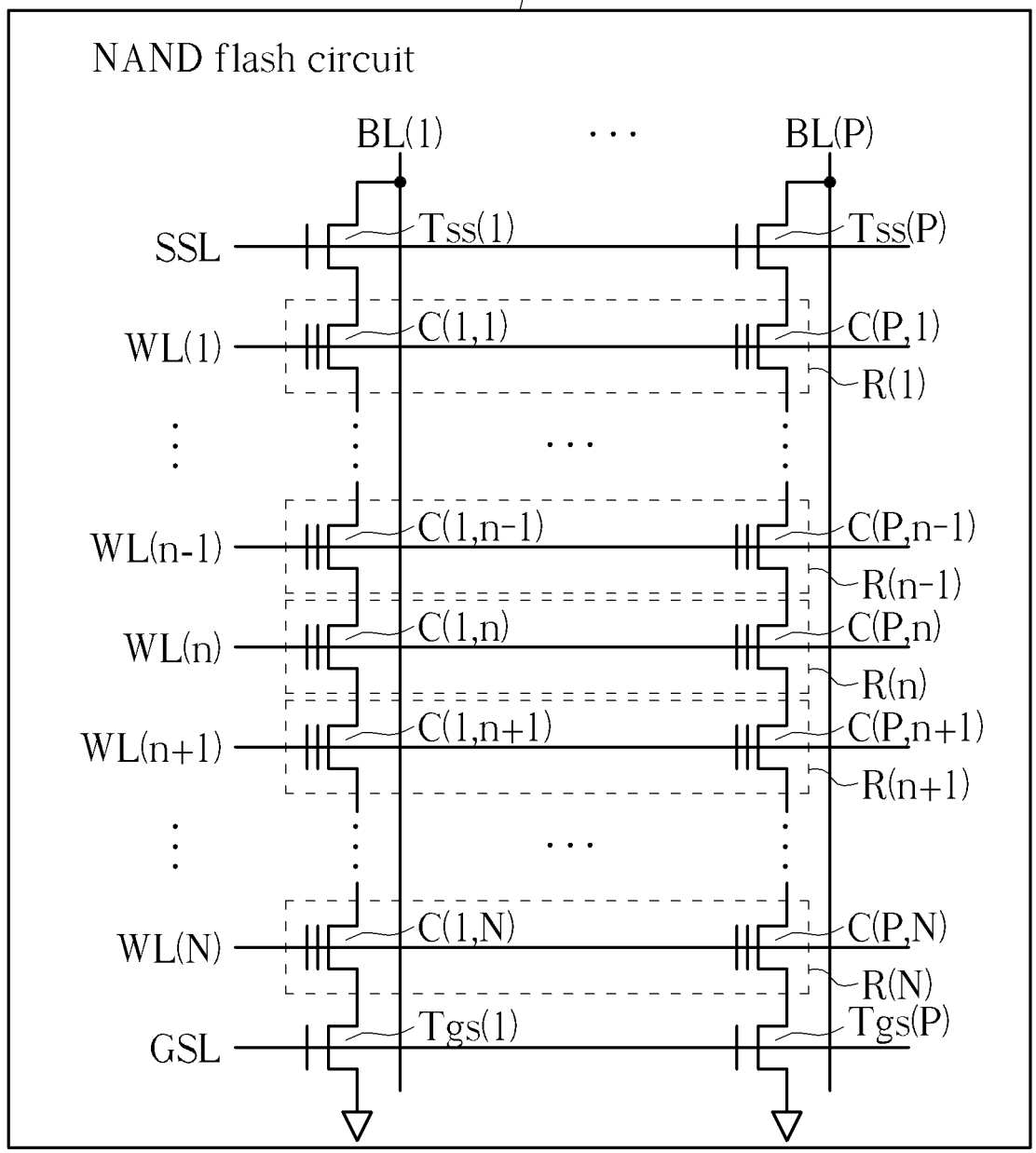
FIG. 2 is a schematic diagram of an NAND flash circuit 14 FIG. 1.

FIG. 2 is a schematic diagram of a NAND flash circuit 14 in FIG. 1. The NAND flash circuit 14 may include memory cells C(1,1) to C(P,N), string select cells Tss(1) to Tss(P) and ground select cells Tgs(1) to Tgs(P). The memory cells C(1,1) to C(P,N) may be arranged into N rows R(1) to R(N) coupled to the respective word lines WL(1) to WL(N). In a read operation, data may be read from the memory cells C(1,1) to C(P,N) in a row-by-row manner from the row (1) to the row (N), or from the row (N) to the row (1). The memory cells C(1,1) to C(P,N) may be floating-gate transistors or charge-trapping transistors, and may be of a single-level cell (SLC) type, a multi-level cell (MLC) type, a triple-level cell (TLC) type, a quad-level cell (QLC) type, a penta-level cell (PLC) type, or a higher-level type. Each memory cell C(p,n) may hold one of Q possible states, where Q is a positive integer equal to or greater than 2, e.g., Q=2 for a QLC, Q=4 for an MLC, Q=8 for a TLC, Q=16 for a QLC, and Q=32 for a PLC. The Q possible states include an erased state S(0) and program states S(1) to S(Q-1), e.g., 8 possible states of a TLC may include an erased state S(0) and program states S(1) to S(7).

Each of the memory cells C(1,1) to C(P,N), the string select cells Tss(1) to Tss(P) and the ground select cells Tgs(1) to Tgs(P) may include a control terminal, a first terminal and a second terminal. The string select line SSL may be coupled to the control terminals of the string select cells Tss(1) to Tss(P), and the bit lines BL(1) to BL(P) may be respectively coupled to the first terminals of the string select cells Tss(1) to Tss(P). The word lines WL(1) to WL(N) may be coupled to the control terminals of the memory cells C(1,1) to C(P,1) of the first row to the control terminals of the memory cells C(1,N) to C(P,N) of the Nth row, respectively, and the first terminals of the memory cells C(1,1) to C(P,1) may be respectively coupled to the second terminals of the string select cells Tss(1) to Tss(P). The ground select line GSL may be coupled to the control terminals of the ground select cells Tgs(1) to Tgs(P), the first terminals of the ground select cells Tgs(1) to Tgs(P) may be respectively coupled to the second terminals of the memory cells C(1,N) to C(P,N), and the second terminals of the ground select cells Tgs(1) to Tgs(P) may be coupled to ground terminals. The ground terminals may provide a ground voltage such as 0V.

Figure 3:
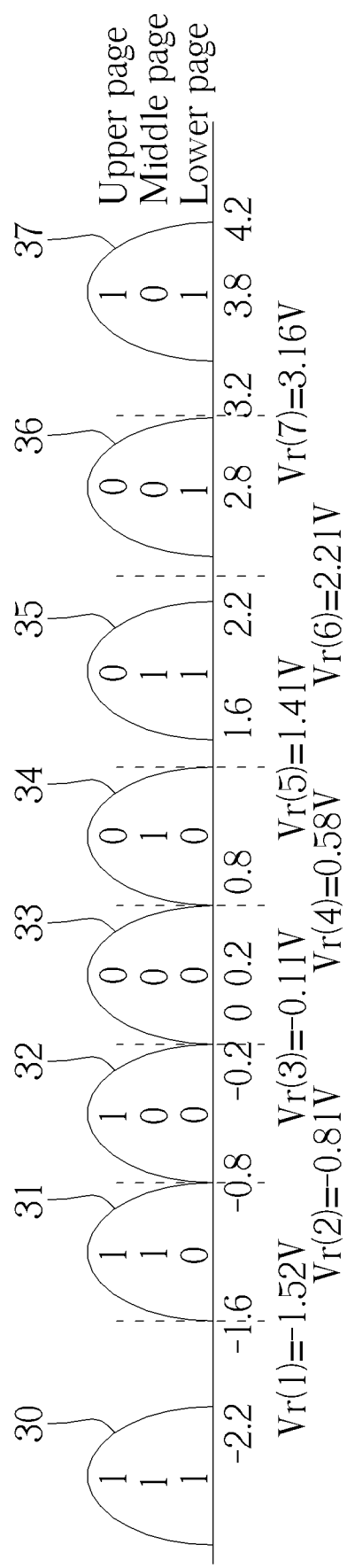
FIG. 3 shows threshold voltage distributions of memory cells in the memory device in FIG. 1.

FIG. 3 shows threshold voltage distributions of 8 states of TLCs, including distributions 30 to 37 corresponding to the erased state S(0) and the program states S(1) to S(7), respectively. The program state S(1) is the lowest program state and the program state S(7) is the highest program state. In a read operation, read levels Vr(1) to Vr(Q-1) may be used to read the state held in each memory cell C(p,n). Each read level Vr(q) may be set between the maximum threshold voltage of the threshold voltage distribution of a state S(q-1) and the minimum threshold voltage of the threshold voltage distribution of a state S(q), so as to distinguish between the states in each memory cell C(p,n), q being an integer and $1 \leq q \leq Q-1$. For example, the read level Vr(1) may be set at −1.52V, between the maximum threshold voltage of the distribution 30 of the erased state S(0) and the minimum threshold voltage of the distribution 31 of the program state S(1). Likewise, the read level Vr(2) may be set at −0.81V, the read level Vr(3) may be set at −0.11V, the read level Vr(4) may be set at 0.58V, the read level Vr(5) may be set at 1.41V, the read level Vr(6) may be set at 2.21V, and the read level Vr(7) may be set at 3.16V. The read level Vr(1) may be used to distinguish between the erased state S(0) and the program state S(1). When the read level Vr(1) is applied to the control terminal of a selected memory cell C(p,n) via a word line WL(n), if the selected memory cell C(p,n) is in the erased state, the selected memory cell C(p,n) may be turned on, and the sense amplifier may detect a current exceeding a predetermined current; and if the selected memory cell C(p,n) is in a higher program state, the selected memory cell C(p,n) may be turned off, and the sense amplifier may detect a current less than a predetermined current. In some embodiments, the row decoder 12 may sequentially apply the read levels Vr(1) to Vr(7) to the word line (n) until the state in the selected memory cell C(p,n) can be identified. The read level Vr(1) may be the first level to be applied to the word line (n), and may be referred to as a start read level of the read operation.

In some embodiments, the program states S(1) to S(7) each includes a most-significant bit, referred to as the "upper page," an intermediate bit, referred to as the "middle page," and a least-significant bit, referred to as the "lower page". While particular coding values may be assigned to the various states of the distribution (e.g., '111' for the erased state S(0), '110' for the program state S(1), '100' for the program state S(2), '000' for the program state S(3), '010' for the program state S(4), '011' for the program state S(5), '001' for the program state S(6), and '101' for the program state S(7)), other coding schemes may also be used within the scope of the present invention. The selected memory cell C(p,n) may be decoded in the sequence of the lower page, middle page and upper page. In order to decode the lower page of the selected memory cell C(p,n), decoding levels may be set at read levels where transitions of the least-significant bit take place, that is, the first decoding level may be set at the read level Vr(1), and the second decoding level may be set as the read level Vr(5). Similarly, in order to decode the middle page of the selected memory cell C(p,n), corresponding decoding levels may be set at read levels where transitions of the intermediate bit take place, e.g., the third decoding level may be set as the read level Vr(2), the fourth decoding level may be set as the read level Vr(4), and the fifth decoding level may be set as the read level Vr(6). In order to decode the upper page of the selected memory cell C(p,n), corresponding decoding levels may be set at read levels where transitions of the most-significant bit take place, e.g., the sixth decoding level may be set as the read level Vr(3), and the seventh decoding level may be set as the read level Vr(7). The coding value of the selected memory cell C(p,n) may be decoded by applying a selective combination of the first decoding level to the seventh read level to the word line (n). Since the lower page is firstly decoded, the first decoding level, or the read level Vr(1), may be the first level to be applied to the word line (n), and may be referred to as the start read level of the read operation.

Specifically, in the read operation, the string select line SSL may be driven to a supply voltage, e.g., 3V, to turn on the string select cells Tss(1) to Tss(P), the ground select line GSL may be driven to the supply voltage to turn on the ground select cells Tgs(1) to Tgs (P), the unselected word lines may be driven to a read pass voltage Vread, and the selected word line W(n) may be driven to a read level Vr(q). The read pass voltage Vread may exceed the maximum threshold voltage of the memory cell in the highest program state to ensure that all unselected memory cells C(p,1) to C(p,n−1), C(p,n+1) to C(p,N) on the selected bit line BL(p) are turned on, leaving only the state of the selected memory cell C(p,n) to be determined using the read level Vr(q). In the case of a TLC in FIG. 3, the read pass voltage Vread may exceed the maximum threshold voltage of the distribution 37, for example, Vread may be 4.5V.

Figure 4:
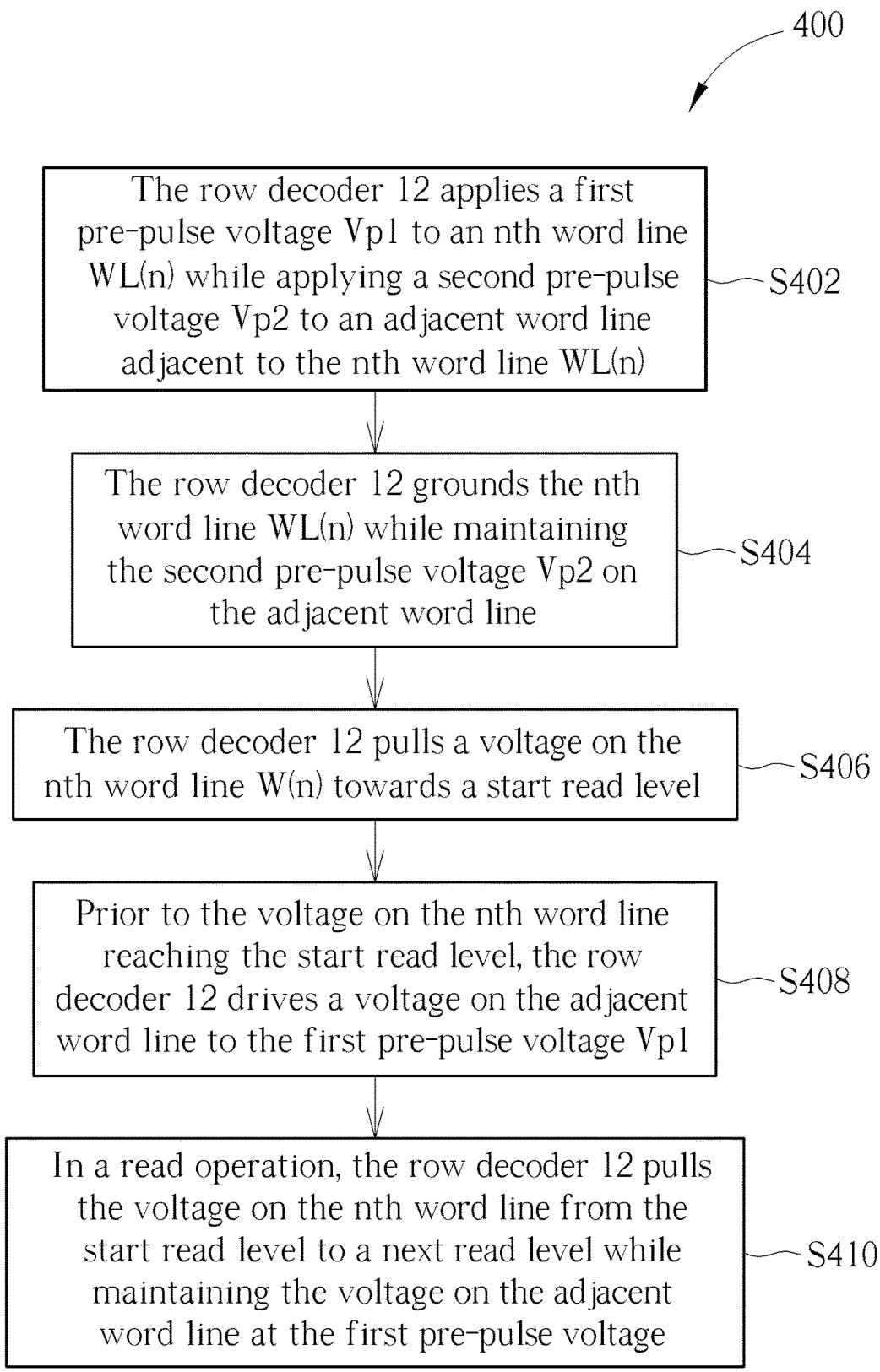
FIG. 4 is a flowchart of a read method for use in the memory device in FIG. 1.
Figure 6:
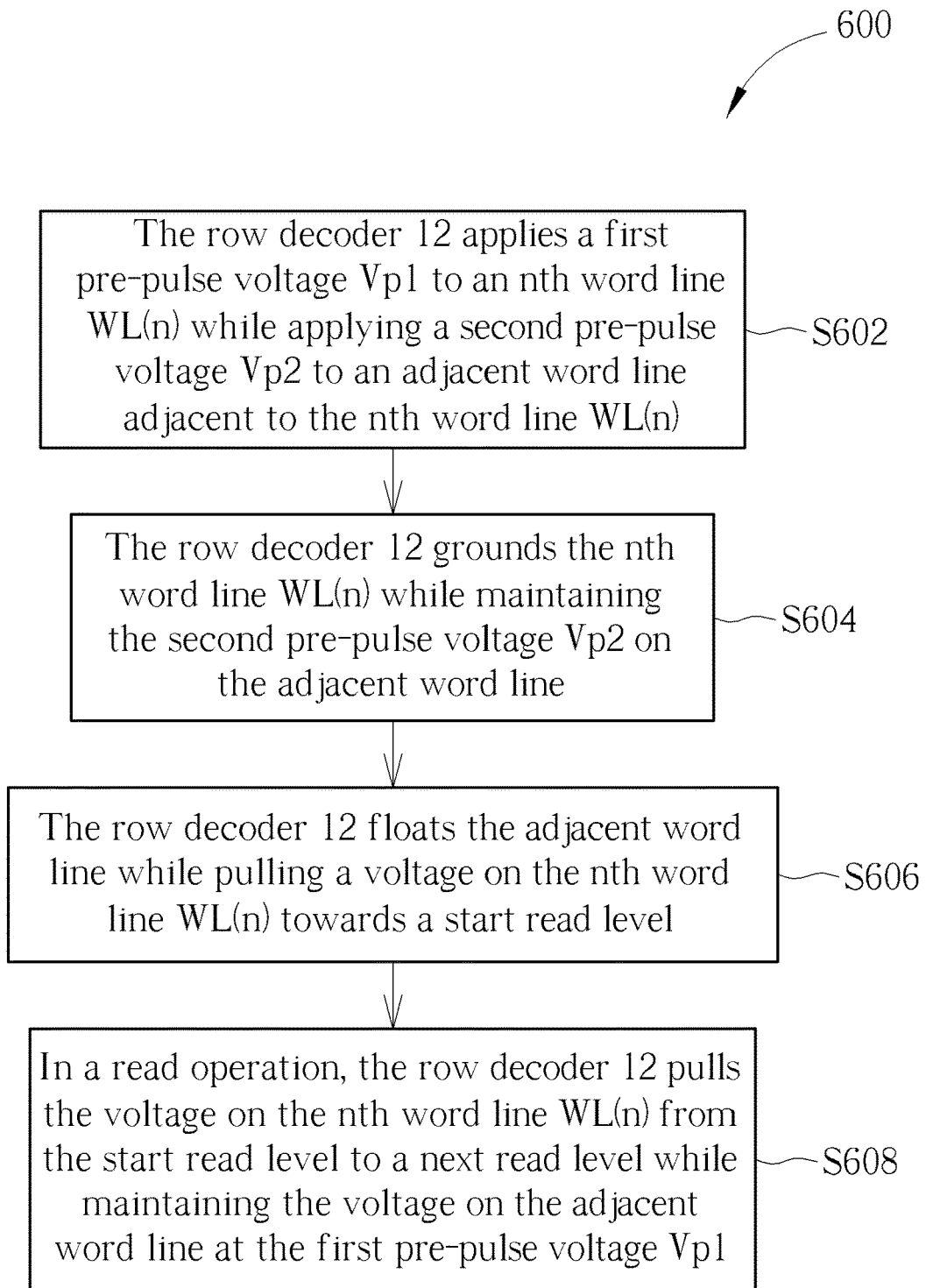
FIG. 6 is a flowchart of another read method for use in the memory device in FIG. 1.

Prior to the read operation, the row decoder 12 may apply pre-pulses to the selected word line WL(n) and the unselected word lines, so as to redistribute charges in channels of memory cells of each cell string of the NAND flash circuit 14 by charge sharing, thereby establishing substantially uniform charge distribution in the channels of the memory cells of each cell string, reducing the level of read disturbance, and enhancing data reliability. The memory device 1 may perform a read method 400 in FIG. 4 or a read method 600 in FIG. 6 to accelerate a read operation.

The read method 400 comprises Steps S402 to S410, employing signal coupling from an adjacent word line of a selected word lines WL(n) to reduce time required for setting up the selected word line WL(n) prior to a read operation. Steps S402 to S408 are used to set up the selected word line WL(n) and the adjacent word line to appropriate voltage levels prior to the read operation. Step S410 is used to perform the read operation. Any reasonable step change or adjustment is within the scope of the disclosure. Steps S402 to S410 are explained as follows:

Step S402: The row decoder 12 applies a first pre-pulse voltage Vp1 to an nth word line WL(n) while applying a second pre-pulse voltage Vp2 to an adjacent word line adjacent to the nth word line WL(n);

Step S404: The row decoder 12 grounds the nth word line WL(n) while maintaining the second pre-pulse voltage Vp2 on the adjacent word line;

Step S406: The row decoder 12 pulls a voltage on the nth word line W(n) towards a start read level;

Step S408: Prior to the voltage on the nth word line reaching the start read level, the row decoder 12 drives a voltage on the adjacent word line to the first pre-pulse voltage Vp1;

Step S410: In a read operation, the row decoder 12 pulls the voltage on the nth word line from the start read level to a next read level while maintaining the voltage on the adjacent word line at the first pre-pulse voltage.

In Step S402, the second pre-pulse voltage Vp2 may exceed the first pre-pulse voltage Vp1 by a predetermined level. The predetermined level may be adjustable by the controller 10 and may be less than 0.7V. The first pre-pulse voltage Vp1 may be substantially equal to the read pass voltage Vread. The first pre-pulse voltage Vp1 and the second pre-pulse voltage Vp2 may be generated by the voltage generation circuit 11. The adjacent word line may be the (n−1)th word line, the (n+1)th word line, both, a portion of or all the unselected word lines. For example, when the first word line WL(1) is selected, the adjacent word line may be the second word line WL(2), all the unselected word lines WL(2) to WL(N) or a portion the unselected word lines, e.g., the word lines WL(2) and WL(3). In another example, when the second word line WL(2) is selected, the adjacent word line may be the first word line WL(1), the third word line WL(3), both the first word line WL(1) and the third word line WL(3), all the unselected word lines WL(1), WL(3) to WL(N), or a portion of the unselected word lines, e.g., the word lines WL(1), WL(3) and WL(4). In some embodiments, if the second pre-pulse voltage Vp2 is applied to a portion of the unselected word lines, the first pre-pulse voltage Vp1 may be applied to the remaining portion of the unselected word lines. For example, when the word lines WL(1), WL(3) to WL(N) are unselected, the second pre-pulse voltage Vp2 may be applied to the unselected word lines WL(1), WL(3) and the first pre-pulse voltage Vp1 may be applied to the unselected word lines WL(4) to WL(N).

The first pre-pulse voltage Vp1 applied to the nth word line WL(n) and the second pre-pulse voltage Vp2 applied to an adjacent word line may redistribute charges in channels of memory cells of each cell string by charge sharing, so as to reduce the level of read disturbance and enhance data reliability.

In Step S404, the nth word line W(n) is grounded, and in Step S406, the nth word line W(n) is driven towards a start read level. The start read level may be the first level used to determine the state of a selected memory cell on the word line WL(n). In some embodiments, the start read level may be a negative voltage level for reading a lowest program state, e.g., the start read level may be the read level Vr(1) for reading the lowest program state S(1) in FIG. 3. In Step S408, the adjacent word line may be driven to the lower first pre-pulse voltage Vp1 to set the adjacent word line to the first pre-pulse voltage, getting reading for the read operation while inducing negative coupling voltage in the selected word line WL(n). The negative coupling voltage may accelerate the rate of voltage change on the selected word line WL(n), effectively reducing time required for driving the voltage on the selected word line WL(n) to the start read level. During driving the adjacent word line to the lower first pre-pulse voltage Vp1, the row encoder 12 may drive or float the selected word line W(n). In some embodiments, prior to the voltage on the selected word line W(n) reaching the start read level, the row encoder 12 may drive the selected word line W(n) to the start read level while driving the adjacent word line to the first pre-pulse voltage, using both the driving from the row encoder 12 and the capacitive coupling from the adjacent word line to drive the selected word line W(n) to the start read level. In other embodiments, prior to the voltage on the selected word line W(n) reaching the start read level, the row encoder 12 may float the selected word line W(n) while driving the adjacent word line to the first pre-pulse voltage, enabling the capacitive coupling from the adjacent word line to drive the selected word line W(n) to the start read level, and upon the voltage on the selected word line W(n) reaching the start read level, the row encoder 12 may hold the voltage on the selected word line W(n) at the start read level and is ready for the read operation. Upon pulling the voltage on the selected word line WL(n) towards the start read level, the row encoder 12 may drive the adjacent word line from the second pre-pulse voltage Vp2 to the first pre-pulse voltage Vp1 without or with a time delay. In some embodiments, the row encoder 12 may maintain the second pre-pulse voltage Vp2 on the adjacent word line during the time delay immediately after pulling the voltage on the selected word line WL(n), and drive the adjacent word line from the second pre-pulse voltage Vp2 to the first pre-pulse voltage Vp1 after the time delay. In other embodiments, the row encoder 12 may drive the adjacent word line from the second pre-pulse voltage Vp2 to the first pre-pulse voltage Vp1 substantially simultaneously with pulling the voltage on the selected word line WL(n) towards the start read level.

After the selected word line W(n) is set to the start read level and the unselected word lines are set to the first pre-pulse voltage, in Step S410, the row decoder 12 may sequentially drive the selected word line W(n) from one read level to the next read level, until the state of the selected memory cell can be determined. For example, the next read level after the start read level may be the read level Vr(2) for reading the second to the lowest program state S(1) in FIG. 3, e.g., the read level Vr(2) may be −0.81V.

Figure 5:
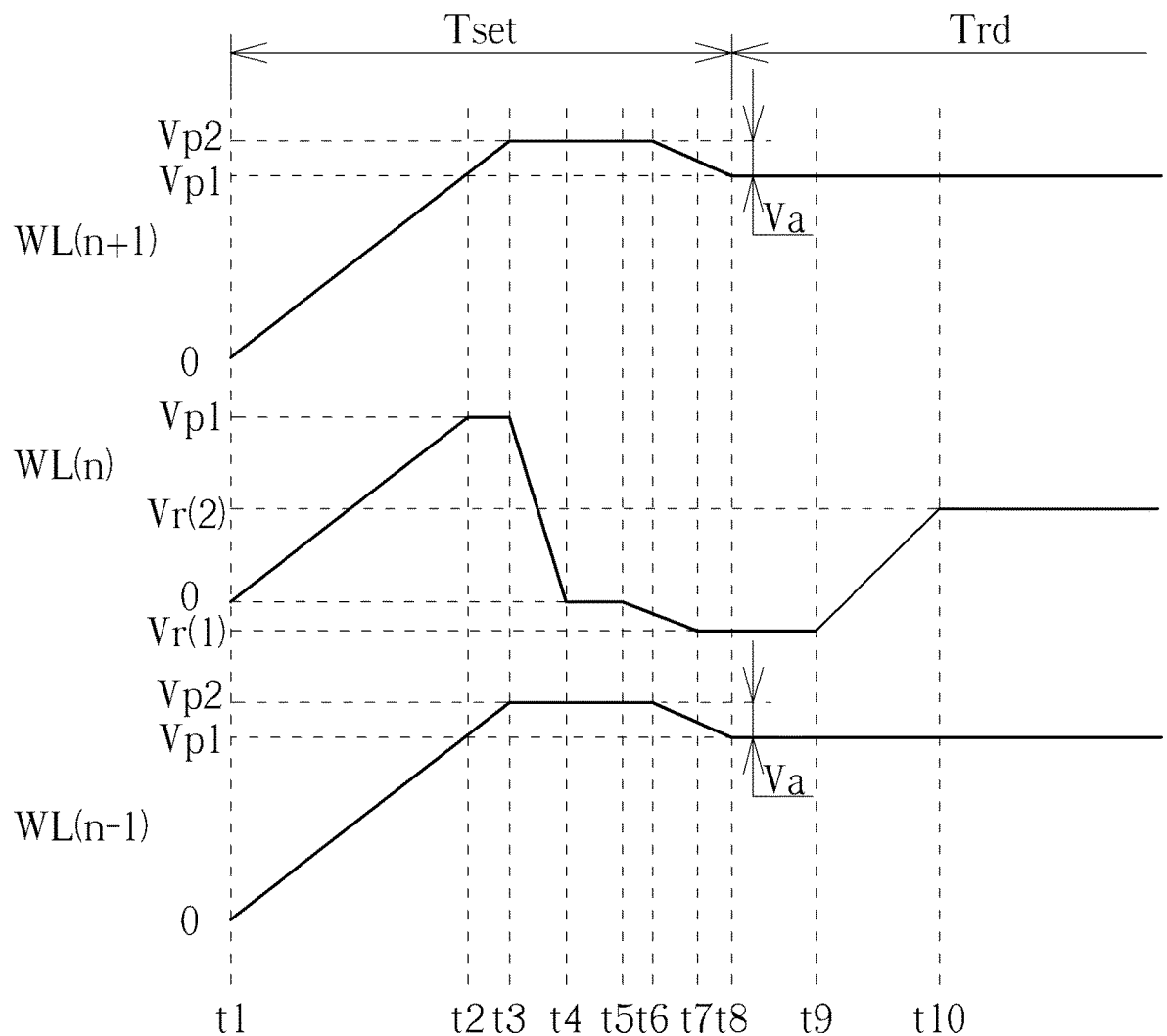
FIG. 5 is a timing diagram of selected signals of the memory device in FIG. 1, employing the read method in FIG. 4.

FIG. 5 is a timing diagram of selected signals of the memory device 1 in FIG. 1, employing the read method 400.

The selected signals include signals on a word line WL(n) and adjacent word lines WL(n−1), WL(n+1). The word line WL(n) may be selected and the adjacent word lines WL(n−1), WL(n+1) may be unselected. The memory device 1 may perform a setup operation in a setup period Tset prior to a read operation in a read period Trd. The setup period Tset is between Times t1 and t8, in which the selected word line WL(n) and the unselected word lines WL(n−1), WL(n+1) are set up for the read operation. From Times t1 to t2, the row decoder 12 drives the selected word line WL(n) and the unselected word lines WL(n−1), WL(n+1) from a ground voltage (e.g., 0V) to the first pre-pulse voltage Vp1 (e.g., 4.5V). From Times t2 to t3, the row decoder 12 continues to drive the unselected word lines WL(n−1), WL(n+1) from the first pre-pulse voltage Vp1 to the second pre-pulse voltage Vp2 (e.g., 5.2V), while holding the selected word line WL(n) at the first pre-pulse voltage Vp1. The second pre-pulse voltage Vp2 exceeds the first pre-pulse voltage Vp1 by a voltage difference Va, and Va may be less than 0.7V. From Times t3 to t4, the row decoder 12 grounds the selected word lines WL(n) from the first pre-pulse voltage Vp1 to the ground voltage, while holding the unselected word lines WL(n−1), WL(n+1) at the second pre-pulse voltage Vp2. From Times t4 to t5, the row decoder 12 maintains the selected word lines WL(n) at the ground voltage, and the unselected word lines WL(n−1), WL(n+1) at the second pre-pulse voltage Vp2. From Times t5 to t6, the row decoder 12 pulls the selected word lines WL(n) from the ground voltage towards the start read level Vr(1), while holding the unselected word lines WL(n−1), WL(n+1) at the second pre-pulse voltage Vp2. From Times t6 to t7, the row decoder 12 drives the unselected word lines WL(n−1), WL(n+1) from the second pre-pulse voltage Vp2 towards the first pre-pulse voltage Vp1. Between Times t6 and t7, the selected word lines WL(n) may be floating or driven by the row decoder 12. In the case of being floating, the selected word lines WL(n) will continue to be driven towards the start read level Vr(1) by the negative coupling voltage induced by the pull-down voltages on the unselected word lines WL(n−1), WL(n+1). In the case of being driven by the row decoder 12, the selected word lines WL(n) will continue to be driven towards the start read level Vr(1) by both the row decoder 12 and the induced negative coupling voltage, reducing time required for reaching the start read level Vr(1). From Times t7 to t8, the row decoder 12 continues to drive the unselected word lines WL(n−1), WL(n+1) until the first pre-pulse voltage Vp1 is reached, while maintaining the selected word lines WL(n) at the start read level Vr(1). In this manner, the memory device 1 uses a reduced time to set the selected word line WL(n) to the start read level Vr(1) and the unselected word lines WL(n−1), WL(n+1) to the first pre-pulse voltage Vp1. After Time t8, the memory device 1 starts the read operation. From Times t8 to t9, upon the voltages on the unselected word lines WL(n−1), WL(n+1) reaching the first pre-pulse voltage Vp1, the row decoder 12 continues to maintain the unselected word lines WL(n−1), WL(n+1) at the first pre-pulse voltage Vp1, and continues to maintain the selected word line WL(n) at the start read level Vr(1). From Times t9 to t10, the row decoder 12 drives the selected word lines WL(n) from the start read level Vr(1) to the next read level Vr(2). After Time t10, the row decoder 12 may continue to drive the selected word lines WL(n) from one read level to another until the state of one or more selected memory cells on the selected word line WL(n) can be determined.

The read method 600 comprises Steps S602 to S608, employing signal coupling from an adjacent word line of a selected word lines WL(n) to reduce time required for setting up the selected word lines WL(n) prior to a read operation. Steps S602 to S606 are used to set up the selected word line WL(n) and the adjacent word line to appropriate voltage levels prior to the read operation. Step S608 is used to perform the read operation. Any reasonable step change or adjustment is within the scope of the disclosure. Steps S602 to S608 are explained as follows:

Step S602: The row decoder 12 applies a first pre-pulse voltage Vp1 to an nth word line WL(n) while applying a second pre-pulse voltage Vp2 to an adjacent word line adjacent to the nth word line WL(n);

Step S604: The row decoder 12 grounds the nth word line WL(n) while maintaining the second pre-pulse voltage Vp2 on the adjacent word line;

Step S606: The row decoder 12 floats the adjacent word line while pulling a voltage on the nth word line WL(n) towards a start read level;

Step S608: In a read operation, the row decoder 12 pulls the voltage on the nth word line WL(n) from the start read level to a next read level while maintaining the voltage on the adjacent word line at the first pre-pulse voltage Vp1.

Steps S602, S604, S608 are similar to Steps S402, S404, S410. In Step S606, the adjacent word line is left floating, the voltage thereon is driven by a capacitive coupling effect induced by the voltage change on the selected word line WL(n), resulting in a voltage ramp on the adjacent word line that brings the voltage of the adjacent word line to the first pre-pulse voltage Vp1. In some embodiments, when the row decoder 12 pulls the selected word line WL(n) towards a negative start read level, there will be a negative voltage change correspondingly induced on the adjacent word line, bringing the adjacent word line from the second pre-pulse voltage Vp2 to the lower first pre-pulse voltage Vp1. In turn, the voltage ramp on the adjacent word line generates a coupling voltage on the selected word line WL(n) to speed up the voltage change on the selected word line WL(n) and decrease the time required for reaching the start read level.

Figure 7:
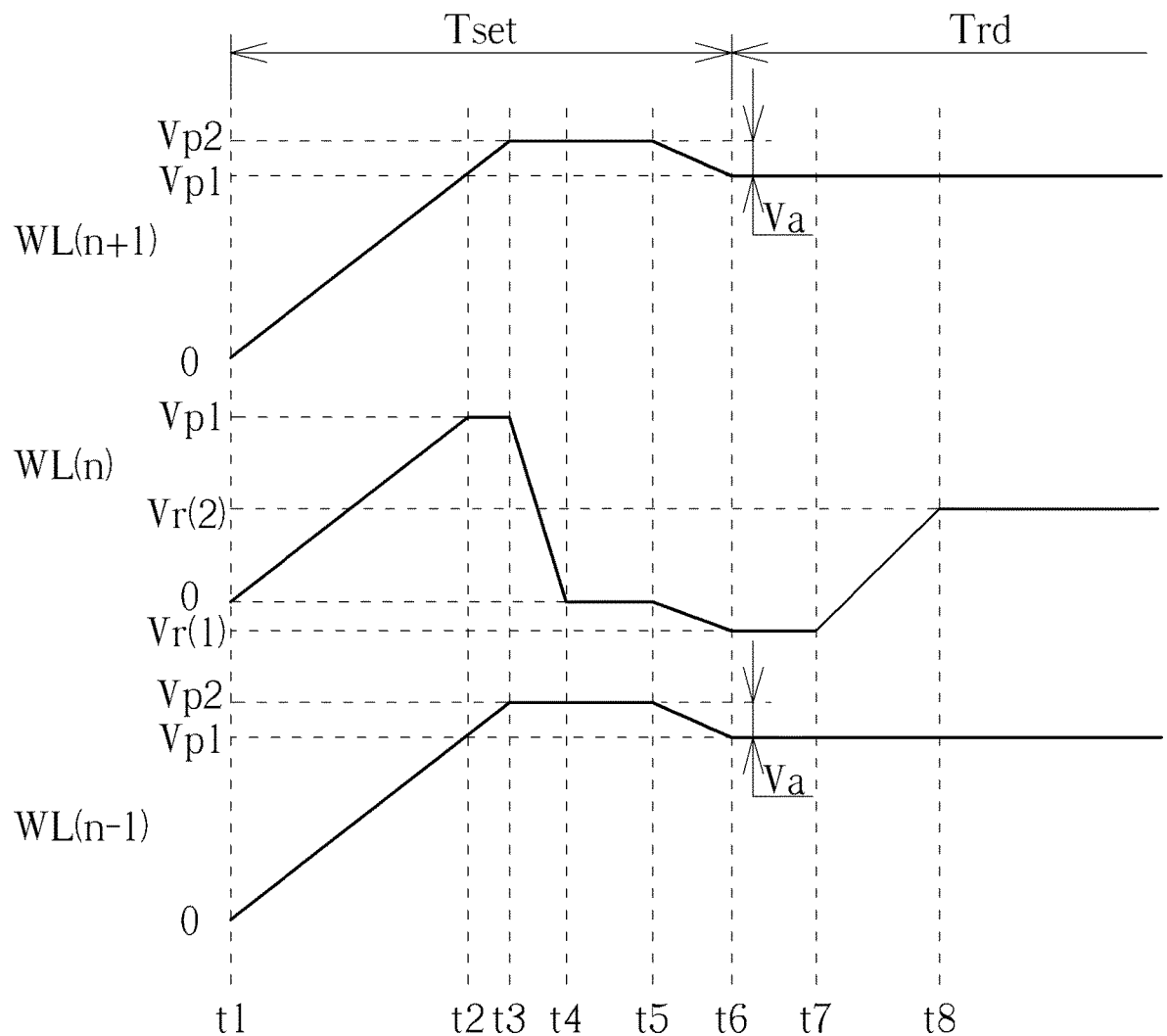
FIG. 7 is a timing diagram of selected signals of the memory device in FIG. 1, employing the read method in FIG. 6.

FIG. 7 is a timing diagram of selected signals of the memory device in FIG. 1, employing the read method 600. The selected signals include signals on a word line WL(n) and adjacent word lines WL(n−1), WL(n+1). The word line WL(n) may be selected and the adjacent word lines WL(n−1), WL(n+1) may be unselected. The memory device 1 may perform a setup operation in a setup period Tset prior to a read operation in a read period Trd. The setup period Tset is between Times t1 and t6, in which the selected word line WL(n) and the unselected word lines WL(n−1), WL(n+1) are set up for the read operation. Between Times t1 and t5, the memory device 1 operates in a manner similar to FIG. 5. From Times t5 to t6, the row decoder 12 drives the selected word line WL(n) from the ground voltage to the start read level Vr(1) and floats the unselected word lines WL(n−1), WL(n+1). Cross coupling may occur between the unselected word lines WL(n−1), WL(n+1) and the selected word line WL(n), the voltage ramp-down on the selected word line WL(n) initiates voltage ramp-downs on the unselected word lines WL(n−1), WL(n+1), and the voltage ramp-downs on the unselected word lines WL(n−1), WL(n+1) further induce a steeper voltage ramp-down on the selected word line WL(n), reducing time taken for driving the selected word line WL(n) from the ground voltage to the start read level Vr(1). From Times t6 to t7, upon the voltages on the unselected word lines WL(n−1), WL(n+1) reaching the first pre-pulse voltage Vp1, the row decoder 12 continues to maintain the unselected word lines WL(n−1), WL(n+1) at the first pre-pulse voltage Vp1, and upon the voltage on the selected word line WL(n) reaching the start read level Vr(1), the row decoder 12 continues to maintain the selected word line WL(n) at the start read level Vr(1). In this manner, the memory device 1 uses a reduced time to set the selected word line WL(n) to the start read level Vr(1) and the unselected word lines WL(n−1), WL(n+1) to the first pre-pulse voltage Vp1. From Times t7 to t8, the row decoder 12 drives the selected word lines WL(n) from the start read level Vr(1) to the next read level Vr(2). After Time t8, the row decoder 12 may continue to drive the selected word lines WL(n) from one read level to another until the state of one or more selected memory cells on the selected word line WL(n) can be determined.

The memory device 1 and the read methods 400, 600 employ a coupling effect from an adjacent word line of a selected word line to drive the selected word line to a start read level at an increased speed, setting the selected word line to the start read level using a reduced time, saving time required for setting up selected word line prior to a read operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of reading data from a memory device, the memory device comprising N rows of memory cells and N word lines coupled thereto, respectively, the method comprising:
   driving an nth word line towards a first pre-pulse voltage while driving an adjacent word line adjacent to the nth word line towards a second pre-pulse voltage, the second pre-pulse voltage exceeding the first pre-pulse voltage, and n being an integer ranging from 1 to N;
   pulling the nth word line from the first pre-pulse voltage to a ground voltage while maintaining the second pre-pulse voltage on the adjacent word line;
   pulling a voltage on the nth word line from the ground voltage to a start read level; and
   prior to the voltage on the nth word line reaching the start read level, starting to drive the adjacent word line from the second pre-pulse voltage to the first pre-pulse voltage.

2. The method of claim 1, further comprising:
   prior to the voltage on the nth word line reaching the start read level, floating the nth word line while driving the adjacent word line from the second pre-pulse voltage to the first pre-pulse voltage.

3. The method of claim 1, further comprising:
   maintaining the second pre-pulse voltage on the adjacent word line while pulling the voltage on the nth word line towards the start read level.

4. The method of claim 1, wherein starting to drive the adjacent word line from the second pre-pulse voltage to the first pre-pulse voltage is performed a period of time after starting to pull the voltage on the nth word line towards the start read level.

5. The method of claim 1, wherein driving the adjacent word line from the second pre-pulse voltage to the first pre-pulse voltage and pulling the nth word line from the ground voltage to the start read level are performed simultaneously.

6. The method of claim 1, wherein the adjacent word line is an (n−1)th word line.

7. The method of claim 1, wherein the adjacent word line is an (n+1)th word line.

8. The method of claim 1, wherein the start read level is a negative voltage level for reading a lowest program state.

9. The method of claim 1, further comprising:
   in a read operation, pulling the voltage on the nth word line from the start read level to a next read level while maintaining a voltage on the adjacent word line at the first pre-pulse voltage.

10. The method of claim 9, wherein the first pre-pulse voltage exceeds the next read level.

11. A method of reading data from a memory device, the memory device comprising N rows of memory cells and N word lines coupled thereto, respectively, the method comprising:
    driving an nth word line towards a first pre-pulse voltage while driving an adjacent word line adjacent to the nth word line towards a second pre-pulse voltage, the second pre-pulse voltage exceeding the first pre-pulse voltage, and n being an integer ranging from 1 to N;
    pulling the nth word line from the first pre-pulse voltage to a ground voltage while maintaining the second pre-pulse voltage on the adjacent word line; and
    floating the adjacent word line while pulling a voltage on the nth word line from the ground voltage to a start read level.

12. The method of claim 11, wherein the adjacent word line is an (n−1)th word line.

13. The method of claim 11, wherein the adjacent word line is an (n+1)th word line.

14. The method of claim 11, wherein the start read level is a negative voltage level for reading a lowest program state.

15. The method of claim 11, further comprising:
    in a read operation, pulling the voltage on the nth word line from the start read level to a next read level while maintaining a voltage on the adjacent word line at the first pre-pulse voltage.

16. The method of claim 15, wherein the first pre-pulse voltage exceeds the next read level.

\* \* \* \* \*